(12) United States Patent
Nguyen

(10) Patent No.: US 11,264,545 B2
(45) Date of Patent: Mar. 1, 2022

(54) LIGHT BAR AND EXTERIOR LIGHTING ASSEMBLY FOR AN AUTOMOTIVE VEHICLE COMPRISING THE SAME

(71) Applicant: Quoc Anh Doan Nguyen, Ho Chi Minh (VN)

(72) Inventor: Quoc Anh Doan Nguyen, Ho Chi Minh (VN)

(73) Assignee: TON DUC THANG UNIVERSITY, Ho Chi Minh (VN)

( * ) Notice: Subject to any disclaimer, the term of this patent is extended or adjusted under 35 U.S.C. 154(b) by 147 days.

(21) Appl. No.: 15/191,487

(22) Filed: Jun. 23, 2016

(65) Prior Publication Data

US 2021/0184089 A1    Jun. 17, 2021

(51) Int. Cl.
*H05B 33/22* (2006.01)
*H01L 33/60* (2010.01)
*H01L 33/62* (2010.01)
*H01L 33/00* (2010.01)

(52) U.S. Cl.
CPC ............ *H01L 33/60* (2013.01); *H01L 33/005* (2013.01); *H01L 33/62* (2013.01); *H05B 33/22* (2013.01); *H01L 2933/0058* (2013.01)

(58) Field of Classification Search
CPC ............................... H01L 33/60; H05B 33/22
USPC ........................................................ 313/503
See application file for complete search history.

(56) References Cited

U.S. PATENT DOCUMENTS

2007/0053185 A1*   3/2007  Whitehead ................ F21K 9/65
                                                              362/249.16

FOREIGN PATENT DOCUMENTS

CN           203810281 U  *  9/2014

* cited by examiner

*Primary Examiner* — Christopher M Raabe

(57) ABSTRACT

A light emitting diode (LED) having a uniform optimal luminance pattern includes an outer cylindrical section, an inner cone shape section completely contained inside the outer section, and a top section having a plurality of microlenses covering the top surface of the outer cylindrical section.

20 Claims, 6 Drawing Sheets

LIGHT BAR AND EXTERIOR LIGHTING ASSEMBLY FOR AN AUTOMOTIVE VEHICLE COMPRISING THE SAME

FIELD OF THE INVENTION

The present invention relates generally to the field of optical devices. More specifically, the present invention relates to light emitting diode (LED).

BACKGROUND ART

Light emitting diodes (LEDs) have many advantages for lighting such as high efficiency, longer life time, fast response, as well as resistance to impact of climate. Thus, LEDs have been considered the most promising illumination solution for the future. However, comparing with conventional light sources such as incandescent bulb, LED usually cannot provide uniform illumination by itself. As a result, LEDs need additional optical devices called secondary lens to produce uniform illumination and proper intensity distribution and to maintain light efficiency.

Total Internal Reflection (TIR) lens is usually considered in secondary lens design because it can control light over a wider range of angles than traditional reflectors or lenses. However, if the lens boundary could not afford total internal reflection, then TIR lens would not reflect the incident light efficiently. Therefore, in order to accomplish TIR lens with high efficiency, at times, a white holder is used to surround the conventional TIR lens, helping to collect the lost light.

FIG. 1 illustrates the components of a conventional LED light system 100A that includes a support base (or fixture) 101 connected to a power source (now shown) via an electrical wire 102. Inside support base 101 a controller circuit board 103 is connected to provide controls to a light emitting diode (LED) bulb 104. A white holder 105 is connected to support base 101 to hold a conventional TIFF lens 106.

Obviously, white holder 105 complicates the manufacturing process and adds costs to conventional LED light 100A.

Next, FIG. 2 illustrates the intensity (luminance) pattern 200 of conventional LED light 100A with white holder 105. Because LED bulb 104 and controller circuit board 103 are located at the center of white holder 105, intensity pattern 200 shows non-optimized areas 210 interspersed with bands of high light intensity 200. This creates imperfect intensity (luminance) pattern 200.

Therefore what is needed is a light emitting diode light that does not need to use a white holder, thus simplifying the manufacturing process and reducing costs of the LED light. Furthermore, what is needed is a light emitting diode that produces uniformly high light intensity pattern.

SUMMARY OF THE INVENTION

Accordingly, an objective of the present invention is to provide a light emitting diode (LED) having a uniform optimal luminance pattern includes an outer cylindrical section, an inner cone shape section completely contained inside the outer section, and a top section having a plurality of micro-lenses covering the top surface of the outer cylindrical section.

Another objective of the present invention is to provide a method of constructing a light emitting diode a light emitting diode (LED) having a uniform optimal luminance pattern includes constructing a cylindrical outer section, constructing an inner cone shape section having a bottom surface, a top surface, and curvature mid-section further comprising a first curvature, a second curvature, and a third curvature, wherein the bottom surface having a through hole where the light emitting diode is positioned; and finding out bands of concentric luminance where the luminance said light emitting diode is not uniform on a target area; constructing a top circular section having a plurality of micro-lenses so that the luminance from said light emitting diode is uniform on said target area when light from said light emitting diode is transmitting through said plurality of micro-lenses.

These and other advantages of the present invention will no doubt become obvious to those of ordinary skill in the art after having read the following detailed description of the preferred embodiments, which are illustrated in the various drawing Figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
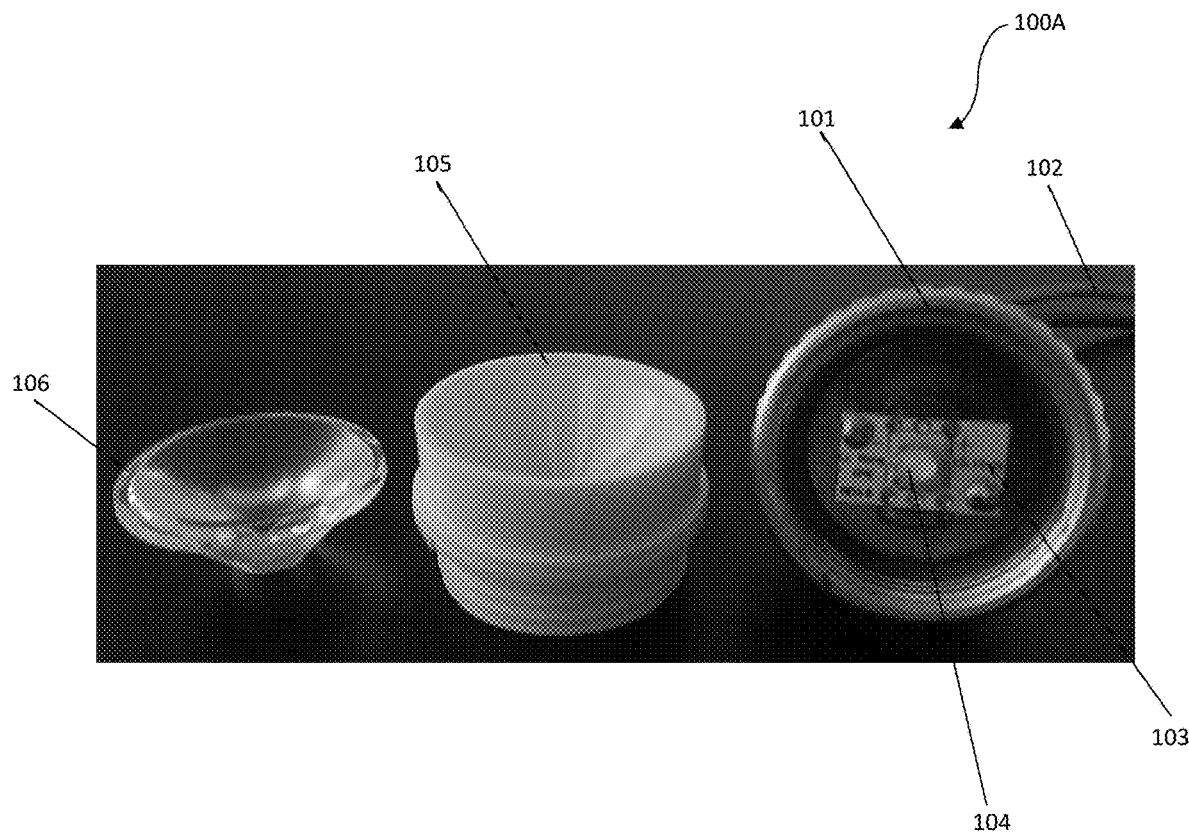
FIG. 1 is a schematic diagram of a conventional light emitting diode having a white holder.
Figure 3:
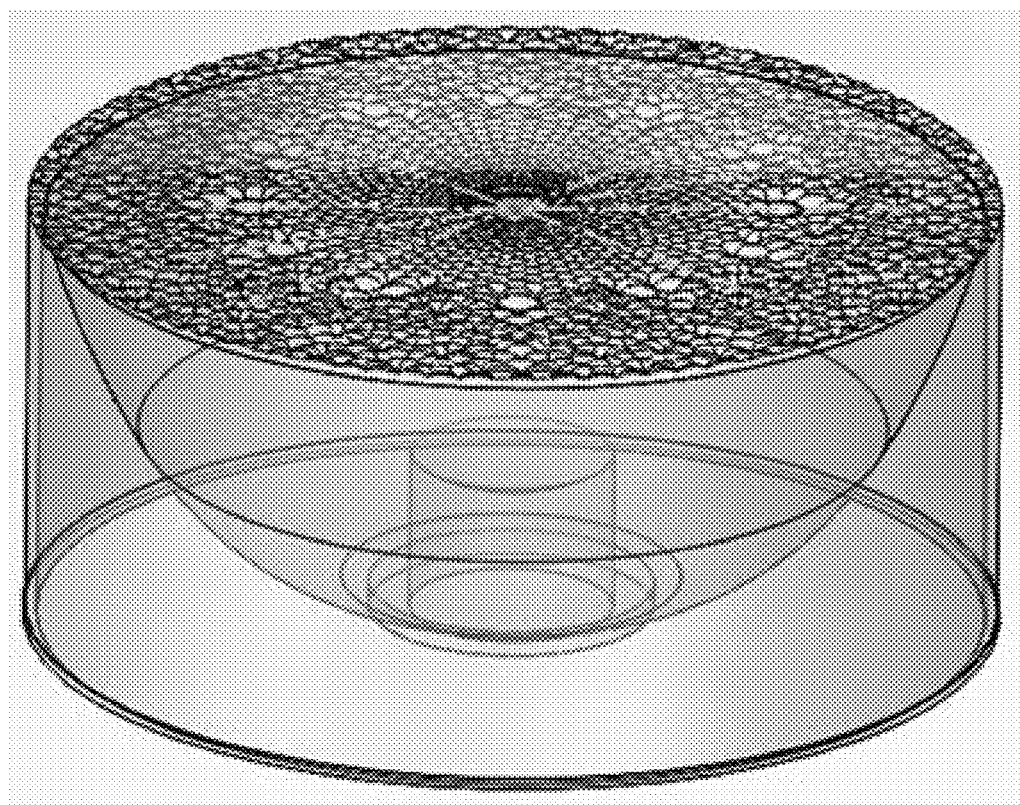
FIG. 3 is a schematic diagram of a light emitting diode (LED) without a white holder in accordance with an embodiment of the present invention.

One embodiment of the invention is now described with reference to FIG. 3. FIG. 3 shows a light emitting diode (LED) device 300 in accordance with an embodiment of the present invention. LED device 300 include an outer cylindrical section 301 an inner cone shape section 302 completely contained inside outer cylindrical section 301. As observed from FIG. 3, inner cone shape section 302 has a bottom surface, a top surface, and curvature mid-section. LED device 300 also includes a top circular section 303 configured to cover the top surface of outer cylindrical section 301 and inner cone shape section 302. The bottom surface of inner cone shape section 302 has a through hole where a light emitting diode bulb described in FIG. 1 is positioned. In one embodiment, top section 303 includes an optical pattern that help optimizing the intensity distribution of a light emitting diode bulb 104.

Figure 4:
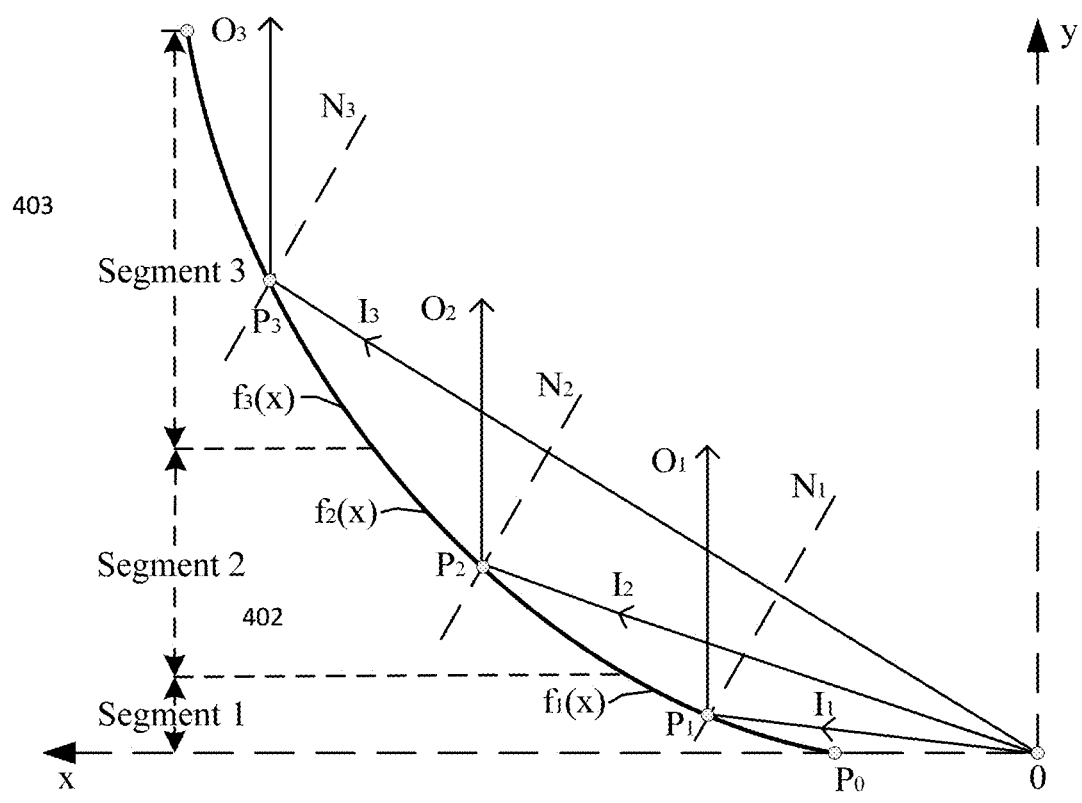
FIG. 4 is a diagram illustrating the curvatures of an inner cone shape section that provides total internal reflection (TIR) to the light emitting diode of the present invention.

Next referring to FIG. 4, a shape 400 of inner cone section 302 is illustrated. Inner cone section 302 comprises a first curvature 401, a second curvature 402, and a third curvature 403. In one embodiment, first curvature 401 second curvature 402, and third curvature 403 obeys an equation $$N_i = \frac{I_i - O_i}{|I_i - O_i|};$$ (equation 1)

where i is a positive integer from 1 to 3, $N_1$ is the normal plane of reflection, is the incident light path, $O_1$ is the reflected light path of first curvature 402. Similarly, $N_2$ is the normal plane of reflection, $I_2$ is the incident light path, $O_2$ is the reflected light path of second curvature 402. $N_3$ is the normal plane of reflection, $I_3$ is the incident light path, $O_3$ is the reflected light path of third curvature 403. As shown in FIG. 4, reflected light paths $O_1$, $O_2$, and $O_3$ are parallel to a y-axis so that total internal reflection occurs within inner cone section 302.

Figure 5:
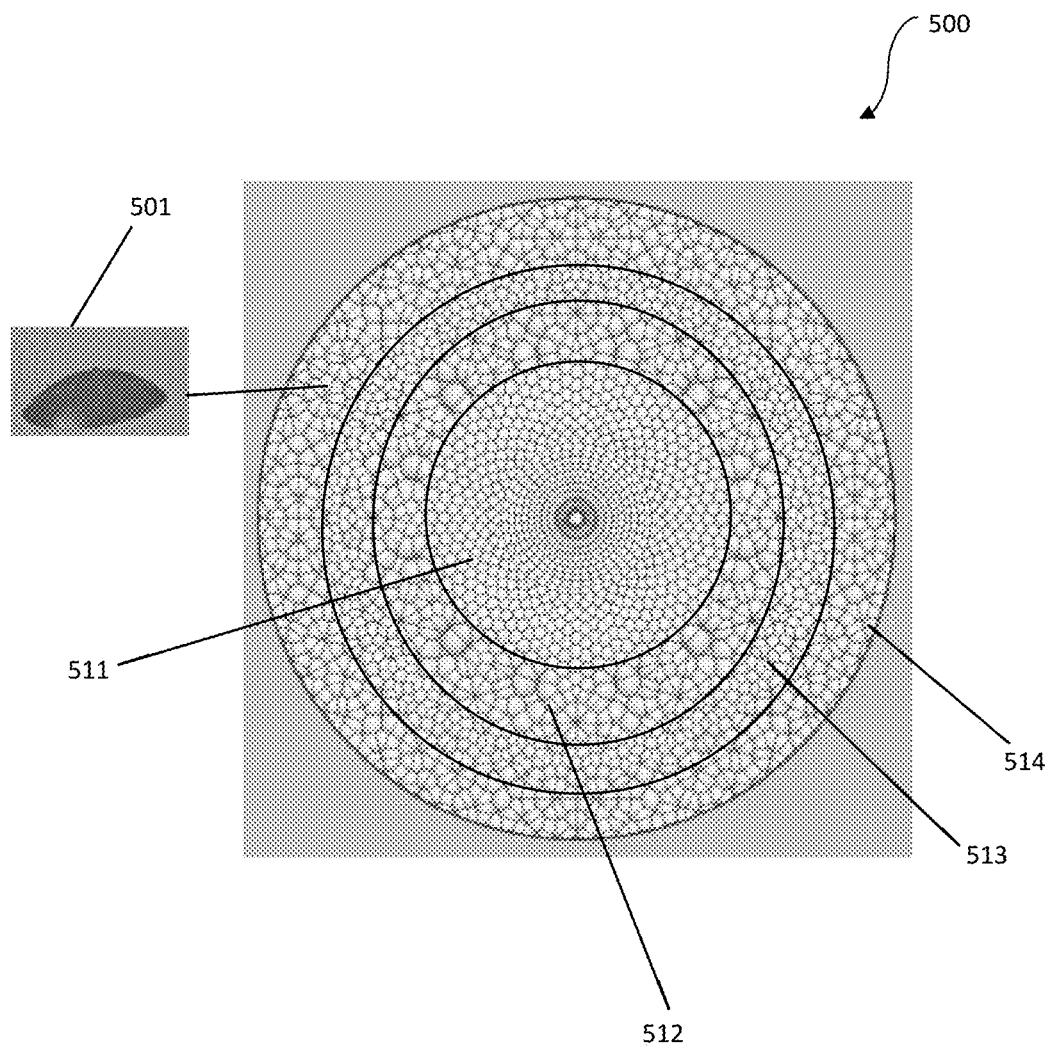
FIG. 5. is a diagram illustrating a top view of a top circular section having different patterns of micro-lenses in accordance with an embodiment of the present invention.

Next, referring to FIG. 5 which shows a top view 500 of top circular section 303 further comprises a plurality of micro-lenses 501. Each micro-lens 501 has a concave dome shape, a height, and a radius. In one embodiment, plurality of micro-lenses 501 on top circular section 303 obeys the following equation:

$$\int\int_A E_f ds = \sum_{i=1}^{Q} \int\int_{C_i} E_i ds = E_{total},$$ (equation 2)

where A is the surface area of the target surface, $E_f$ is the luminance on the target surface, Q is the number of micro-lens 501, $C_i$ is the surface area of each micro-lens 501, $E_i$ is the luminance of each micro-lens 501, and $E_{total}$ is the luminance from light emitting diode bulb 104.

Figure 2:
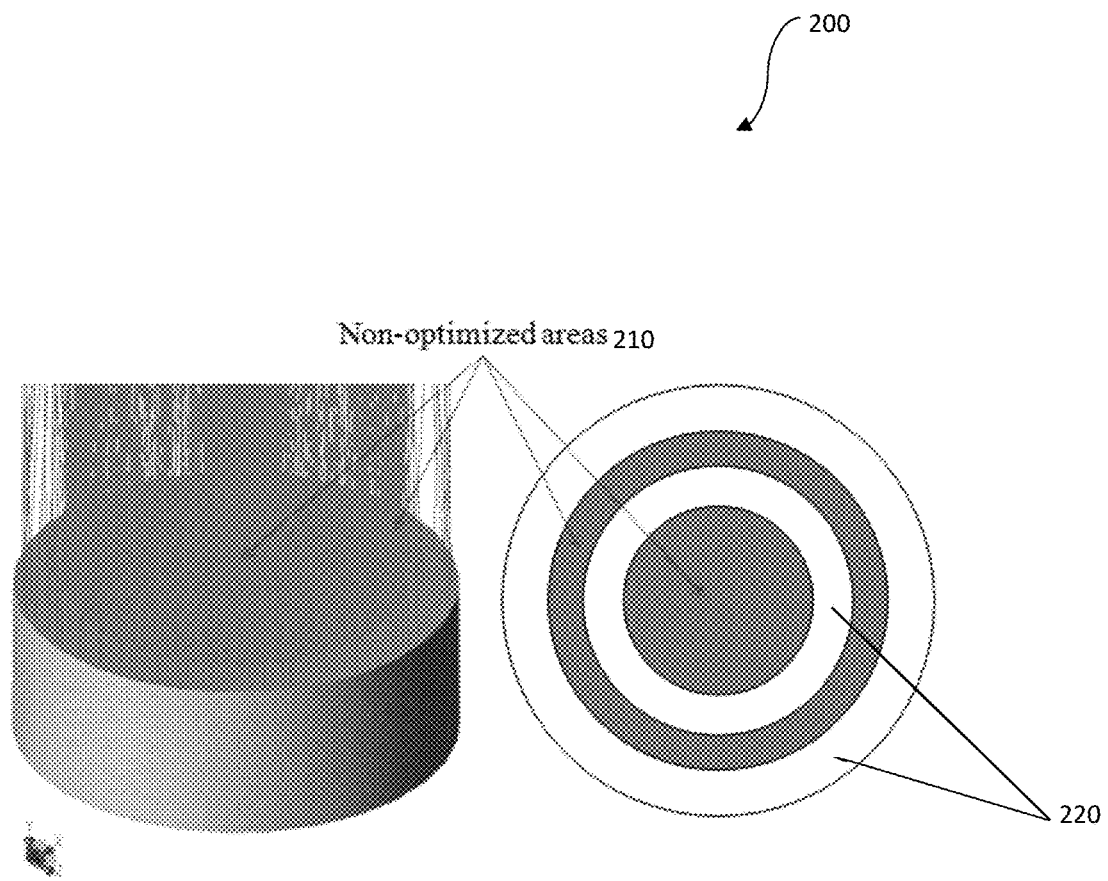
FIG. 2 is a diagram illustrating a luminance pattern of a conventional light emitting diode (LED) showing non-uniform bands of luminance.

Continuing with FIG. 5, in order to achieve equation 2, plurality of micro-lenses 501 is divided into concentric bands of different densities and micro-lens patterns. As seen in FIG. 5, plurality of micro-lenses 501 comprises four concentric bands: a first concentric band 511 is at the center of top circular section 303, a second concentric band 512 is contiguous to first concentric band 511, a third concentric band 513 is contiguous to second band 512, and a fourth concentric band 514 is the outermost band and is contiguous to third concentric band 513. In the preferred embodiment, first concentric band 511 has the same density and micro-lens pattern; while second concentric band 512 and fourth concentric band have the same density and micro-lens pattern. This is because first to fourth concentric bands 511-514 are designed to eliminate non-optimized areas of intensity 210 as shown in FIG. 2 in order to achieve optimal and uniform intensity described in equation 2.

Figure 6:
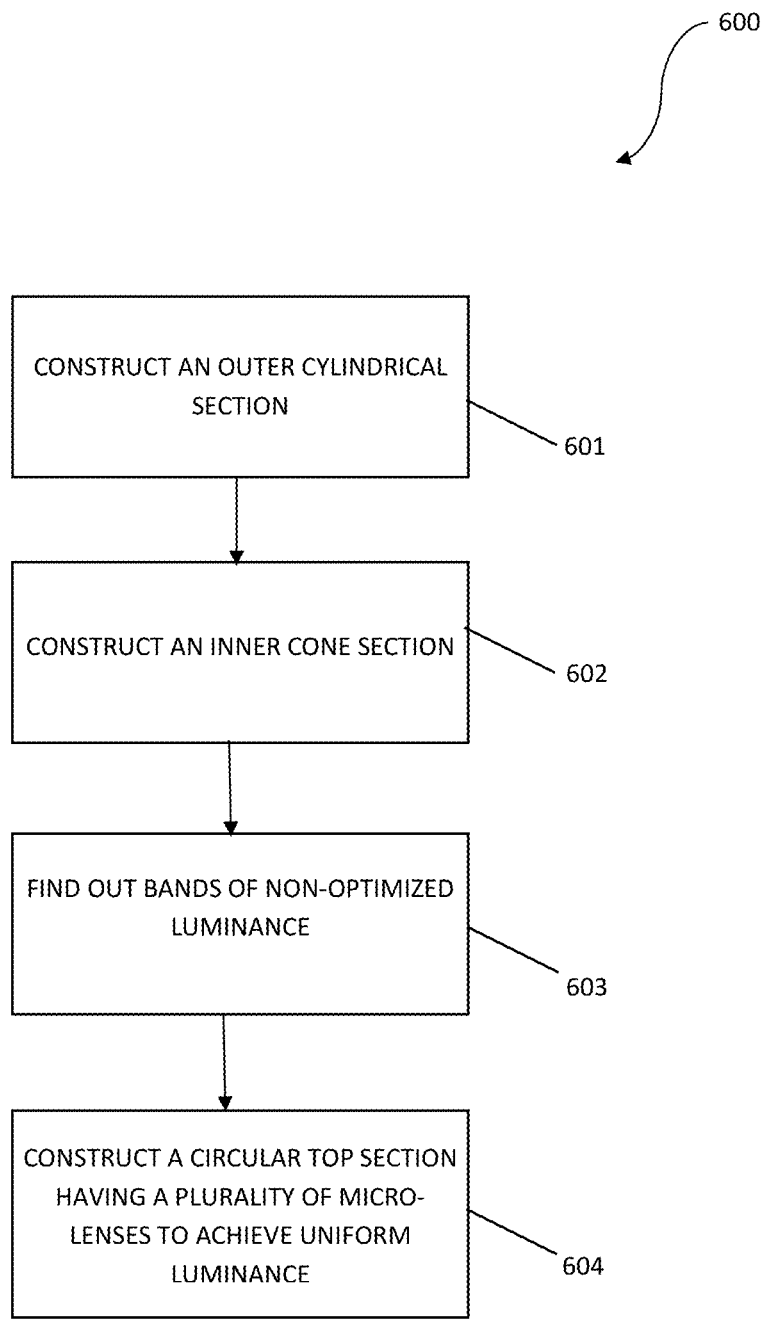
FIG. 6 is a flow chart illustrating a steps to obtaining the light emitting diode (LED) of FIG. 3 in accordance with an embodiment of the present invention.

Finally, referring to FIG. 6 which illustrates a method 600 of manufacturing a light emitting device (LED) 300 in accordance with an embodiment of the present invention. Method 600 includes constructing an outer cylindrical section, constructing an inner cone section, detecting bands of non-optimized intensity (luminance), and constructing a circular top section having a plurality of micro-lenses.

At step 601, an outer cylindrical section is constructed. Step 601 is achieved by an injection molding process. The result is outer cylindrical section 301 as described above. Outer cylindrical section 301 is made of transparent materials such as glass or silicone.

Next at step 602, an inner cone section is constructed. Step 602 is achieved by dividing inner cone section 302 into first curvature 401, second curvature 402, and third curvature 403 that obey the equation 1 and described in FIG. 4 above. Step 602 is also realized by injection molding process using transparent materials such as glass or silicones. In this exemplary process, a through hole is created at the bottom of inner cone section 302 where LED bulb 104 is located.

Now at step 603, non-optimized luminance areas of outer cylindrical section and inner cone section are detected. After the outer cylindrical section and inner cone section are made, they are tested for non-optimized luminance areas as shown in FIG. 2 that include concentric bands of non-uniform luminance 210 and 220.

Finally, at step 604, a circular top section is formed based on equation 2 above that includes a plurality of micro-lenses. The plurality of micro-lenses are divided into concentric bands based on the result from step 603. In one exemplary embodiment, the non-optimized luminance includes four different regions as shown in FIG. 2. Therefore, there are four concentric bands of micro-lenses. Each concentric band has different densities and patterns. The density and micro-lenses pattern in each concentric band are obtained using an iterative method in solving equation 2 above. Once the solution is found, the final luminance is optimal and uniform.

Continuing with step 604, in one preferred embodiment, the iterative method solves equation 2 above results in the following solutions: in first concentric band 511, the radius of each micro-lens 501 increases radially from the center of top circular section 303. This pattern is repeated by rotating the first ray of micro-lenses 360 degrees to completely fill out first concentric band 511. First concentric band 511 has the same pattern of micro-lenses as third concentric band 513 (because non-optimized areas 210 as shown in FIG. 2). As a result, the radius of micro-lenses 501 in third concentric band 513 equals to the largest radius of micro-lenses 501 in first concentric band 511.

Continuing with iterative solution of equation 2 above, second concentric band 512 and fourth concentric band 514 have the same pattern (because of areas 220 in FIG. 2). Furthermore, each micro-lens 501 in second concentric band 512 and said fourth concentric 514 has greater radius than the largest micro-lens 501 in first concentric band 511 and third concentric band 513.

In addition, the pattern of micro-lenses 501 in second concentric band 512 and fourth concentric band 514 are different from that of first concentric band 511. In second concentric band 512 and fourth concentric band 514, initial micro-lens 501 is obtained. Next, a cluster of micro-lenses is created by rotating initial micro-lens 501 around an axis vertical to the page of FIG. 5. The same cluster is repeated contiguous to each other so that second concentric band 512 and fourth concentric band 514 are filled up.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A light emitting diode (LED), comprising:
    an outer cylindrical section;
    an inner cone shape section completely contained inside said outer section, said inner cone shape section having a bottom surface, a top surface, and curvature mid-section comprising a first curvature, a second curvature, and a third curvature; and
    a top section covering the top surface of said outer cylindrical section and said inner cone shape section, wherein the bottom surface of said inner cone shape section has a through hole where said light emitting diode is positioned.

2. The light emitting diode (LED) of claim 1 wherein said first curvature, said second curvature, and said third curvature obeys an equation $$N_i = \frac{I_i - O_i}{|I_i - O_i|},$$

where i is a positive integer from 1 to 3, $N_1$ is the normal plane of reflection, $I_1$ is the incident light path, $O_1$ is the reflected light path of said first curvature, wherein $N_2$ is the normal plane of reflection, $I_2$ is the incident light path, $O_2$ is the reflected light path of said second curvature, and $N_3$ is the normal plane of reflection $I_2$ is the incident light path, $O_3$ is the reflected light path of said third curvature.

3. The light emitting diode (LED) of claim 1 wherein said top circular section further comprises a plurality of micro-lenses, each having a concave dome shape having a height and a radius.

4. The light emitting diode (LED) of claim 3, wherein said plurality of micro-lenses is divided into concentric bands of different densities of micro-lens.

5. The light emitting diode (LED) of claim 4 wherein said plurality of micro-lenses is obeyed the following equation:

$$\iint_A E_f \, ds = \sum_{i=1}^{Q} \iint_{Ci} E_i ds = E_{total},$$

wherein A is the surface area of the target surface, $E_f$ is the luminance on the target surface, Q is the number of micro-lens, $C_i$ is the surface area of each micro-lens, $E_i$ is the luminance of each micro-lens, and $E_{total}$ is the luminance from said light emitting diode.

6. The light emitting diode (LED) of claim 4 wherein said plurality of micro-lenses comprises four concentric bands, wherein said first concentric band is at the center of said top circular section, said second concentric band is contiguous to said first band, said third concentric band is contiguous to said second band, and said fourth concentric band is contiguous to said third band.

7. The light emitting diode (LED) of claim 6 wherein the radius of said micro-lens in said first concentric band increases starting from the center of said top circular section into a first pattern of micro-lenses, and said first pattern of micro-lenses are duplicated by rotating around the center of said top circular section so that said first pattern of micro-lenses fill up said first concentric band.

8. The light emitting diode (LED) of claim 7 wherein each of said micro-lens in said second concentric band and said fourth concentric has larger radius than the largest micro-lens in said first concentric band and said third concentric band.

9. The light emitting diode (LED) of claim 7 wherein said micro-lenses in said second concentric band and said fourth concentric band are generated by rotating an initial micro-lens around a reference axis into a cluster of micro-lenses, sand said cluster of micro-lenses is duplicated so that said cluster of micro-lenses fill up the area of said second concentric band and said fourth concentric band respectively.

10. The light emitting diode (LED) of claim 7 wherein the radius of said micro-lenses in said third concentric band has the same radius as the largest micro-lens in said first concentric band.

11. A method of constructing a light emitting diode (LED) having a uniform luminance, comprising:
    constructing a cylindrical outer section;
    constructing an inner cone shape section having a bottom surface, a top surface, and curvature mid-section further comprising a first curvature, a second curvature, and a third curvature, wherein said bottom surface having a through hole where said light emitting diode is positioned; and
    finding out bands of concentric luminance where the luminance said light emitting diode is not uniform on a target area;
    constructing a top circular section having a plurality of micro-lenses so that the luminance from said light emitting diode is uniform on said target area when light from said light emitting diode is transmitting through said plurality of micro-lenses.

12. The method of claim 11 wherein said first curvature, said second curvature, and said third curvature obeying the following equation:

$$N_i = \frac{I_i - O_i}{|I_i - O_i|},$$

where i is a positive integer from 1 to 3, $N_1$ is the normal plane of reflection, $I_1$ is the incident light path, $O_1$ is the reflected light path of said first curvature, wherein $N_2$ is the normal plane of reflection, $I_2$ is the incident light path, $O_2$ is the reflected light path of said second curvature, and $N_3$ is the normal plane of reflection $I_2$ is the incident light path, $O_3$ is the reflected light path of said third curvature.

13. The method of claim 11, wherein said plurality of micro-lenses are constructed according to a second equation:

$$\iint_A E_f \, ds = \sum_{i=1}^{Q} \iint_{Ci} E_i ds = E_{total},$$

wherein A is the surface area of the target surface, $E_f$ is the luminance on the target surface, Q is the number of micro-lens, $C_i$ is the surface area of each micro-lens, $E_i$ is the luminance of each micro-lens, and $E_{total}$ is the luminance from said light emitting diode.

14. The method of claim 13 wherein said plurality of micro-lenses comprises four concentric bands, wherein said first concentric band is at the center of said top circular section, said second concentric band is contiguous to said first band, said third concentric band is contiguous to said second band, and said fourth concentric band is contiguous to said third band.

15. The method of claim 14 wherein the radius of said micro-lens in said first concentric band increases starting from the center of said top circular section into a first pattern of micro-lenses, and said first pattern of micro-lenses are duplicated by rotating around the center of said top circular section so that said first pattern of micro-lenses fill up said first concentric band.

16. The method of claim 15 wherein each of said micro-lens in said second concentric band and said fourth concentric has larger radius than the largest micro-lens in said first concentric band and said third concentric band.

17. The method of claim 16 wherein said micro-lenses in said second concentric band and said fourth concentric band are generated by rotating an initial micro-lens around a reference axis into a cluster of micro-lenses, sand said cluster of micro-lenses is duplicated so that said cluster of micro-lenses fill up the area of said second concentric band and said fourth concentric band respectively.

18. The method of claim 17 wherein the radius of said micro-lenses in said third concentric band has the same radius as the largest micro-lens in said first concentric band.

19. A light transmitting device comprising:
a support base;
a light emitting diode mechanically supported by said support base;
a controller, electrically coupled to said power source, operable to control said light emitting device; and
a power source electrically coupled to provide operating voltage supplies to both said light emitting diode and said controller, wherein said light emitting diode further comprises:

an outer cylindrical section;
an inner cone shape section completely contained inside said outer section, said inner cone shape section having a bottom surface, a top surface, and curvature mid-section comprising a first curvature, a second curvature, and a third curvature; and
a top section covering the top surface of said outer cylindrical section and said inner cone shape section, wherein the bottom surface of said inner cone shape section has a through hole where said light emitting diode is positioned.

20. The light transmitting device of claim 19 wherein said first curvature, said second curvature, and said third curvature obeys an equation $$N_i = \frac{I_i - O_i}{|I_i - O_i|},$$

where i is a positive integer from 1 to 3, $N_1$ is the normal plane of reflection, $I_1$ is the incident light path, $O_1$ is the reflected light path of said first curvature, wherein $N_2$ is the normal plane of reflection, $I_2$ is the incident light path, $O_2$ is the reflected light path of said second curvature, and $N_3$ is the normal plane of reflection $I_2$ is the incident light path, $O_3$ is the reflected light path of said third curvature; and wherein said plurality of micro-lens is obeyed the following equation:

$$\iint_A E_f \, ds = \sum_{i=1}^{Q} \iint_{Ci} E_i ds = E_{total},$$

wherein A is the surface area of the target surface, $E_f$ is the luminance on the target surface, Q is the number of micro-lens, $C_i$ is the surface area of each micro-lens, $E_i$ is the luminance of each micro-lens, and $E_{total}$ is the luminance from said light emitting diode.

* * * * *